United States Patent [19]

Oppelt et al.

[11] Patent Number: 5,153,517
[45] Date of Patent: Oct. 6, 1992

[54] SURFACE RESONATOR FOR A MAGNETIC RESONANCE IMAGING APPARATUS

[75] Inventors: Ralph Oppelt, Weiher; Wilhelm Duerr; Horst Siebold, both of Erlangen, all of Fed. Rep. of Germany

[73] Assignee: Siemens Aktiengesellschaft, Munich, Fed. Rep. of Germany

[21] Appl. No.: 626,442

[22] Filed: Dec. 12, 1990

[30] Foreign Application Priority Data

Dec. 12, 1989 [EP] European Pat. Off. ............ 89122971

[51] Int. Cl.$^5$ .............................................. G01R 33/20
[52] U.S. Cl. ..................................... 324/322; 324/318
[58] Field of Search ............................... 324/322, 318; 128/653.2

[56] References Cited

U.S. PATENT DOCUMENTS

| | | | |
|---|---|---|---|
| 4,594,566 | 6/1986 | Maudsley | 324/318 |
| 4,746,866 | 11/1986 | Roschmann | 324/322 |
| 4,752,736 | 1/1988 | Arakawa et al. | 324/322 |
| 4,775,837 | 10/1988 | Roschmann | 324/322 |
| 4,793,356 | 12/1988 | Misic et al. | 324/322 |
| 4,816,765 | 3/1989 | Boskamp | 324/318 |
| 4,825,162 | 4/1989 | Roemer et al. | 324/318 |
| 4,825,164 | 5/1989 | Requardt | 324/322 |
| 4,833,429 | 5/1989 | Keren et al. | 324/322 |
| 4,839,595 | 6/1989 | Boskamp | 324/318 |
| 4,906,933 | 3/1990 | Keren | 324/318 |
| 4,973,908 | 11/1990 | Bottomley et al. | 324/318 |

FOREIGN PATENT DOCUMENTS

| | | |
|---|---|---|
| 0161782 | 11/1985 | European Pat. Off. . |
| 0274733 | 7/1988 | European Pat. Off. . |
| 0290187 | 11/1988 | European Pat. Off. . |

OTHER PUBLICATIONS

"Quadrature Detection Coils—A Further $\sqrt{2}$ Improvement in Sensitivity," Chen et al. J. Mag. Res. vol. 54, (1983) pp. 324–327.

"Quadrature Detection Surface Coil," Hyde et al. Mag. Res. in Med., vol. 4 (1987) pp. 179–184.

"Inductive Coupling to the Slotted–Tube Quadrature Probe," Yoda et al. J. mag. Res. vol. 81 (1989) pp. 284–287.

Primary Examiner—Michael J. Tokar
Assistant Examiner—Raymond Y. Mah

[57] ABSTRACT

A surface resonator for use in a magnetic resonance imaging apparatus having a transversal fundamental magnetic field is composed of two sub-systems, each generating a magnetic field with the magnetic fields being perpendicular relative to each other. Each sub-system contains two current loops, both of which enclose the magnetic field allocated to them in the same plane. A circularly polarizing surface resonator is thus obtained for the transversal fundamental magnetic field.

20 Claims, 6 Drawing Sheets

SURFACE RESONATOR FOR A MAGNETIC RESONANCE IMAGING APPARATUS

BACKGROUND OF THE INVENTION

1. Field of the Invention

The present invention is directed to a resonator suitable for use in a magnetic resonance imaging apparatus (MRI or nuclear magnetic resonance (NMR) for diagnostic examination of an examination subject, such as a human body.

2. Description of the Prior Art

In a magnetic resonance imaging apparatus which is used for medical diagnostic of a human body, the body axis is usually oriented along the X-axis of a rectangular coordinate system. The body region to be examined is situated between the pole pieces of a magnet which generates a fundamental magnetic field extending in the direction of the z-axis. A resonator is provided for transmitting the excitation signals and receiving the resonance signals. It is known to construct such a resonator as a combination of two sub-systems, which are respectively connected to a transmitter and a receiver via a network which serves the purpose of frequency tuning, load matching and balancing and via a common 90°/3dB directional coupler.

In addition to obtaining tomograms of an examination subject, magnetic resonance imaging can be used to undertake diagnostics of joints and to portray blood vessels. An image is constructed by computational or mensurational analysis of integral proton resonance signals from the spatial spin density, or analysis of the of the distribution of relaxation times, of the examination subject. The examination subject is introduced into a uniform magnetic field, referred to as the fundamental field, which aligns the nuclear spins in the body. Gradient coils are provided which generate spatially different magnetic fields. A RF antenna excites the nuclear spins, and receives the measured signals induced by the excited nuclear spins, which are forwarded to a receiver. This RF antenna is generally connected to a transmitter and a receiver via a network having matching capacitances, as well as via a transmission and reception diplexer. The maximum pulse transmission power is established by the load limit of these components, whereas the maximum mean transmission power is essentially limited by the extent to which localized heating of the examination subject can be safely tolerated.

As is known, a low transmission power requires circularly polarizing antennas. Such antennas have the advantage of generating only the field components which are effective for the nuclear magnetic resonance, for example counter-clockwise field components. Such an antenna, for example, may be formed by two linearly polarizing antenna systems arranged orthogonally relative to each other, and connected to a transmitter and to a receiver via a 90° directional coupler. The supplied transmission signal is divided between the two systems with a 90° phase shift, and generates the rotational field which is effective for the nuclear magnetic tomography. In the reception mode, the antenna represents two useful signal sources phase-shifted by 90°, and also represents two uncorrelated noise sources. The 90° directional coupler supplies the receiver with the in-phase sum of the useful signals. Such as antenna system is described in the article "Quadrature Detection Coils- A Further √2 Improvement in Sensitivity," Chen et al., Journal of Magnetic Resonance, Vol. 54, (1983) pp: 324-327.

Antenna systems known as surface resonators are also known which can be used for obtaining an image of certain body regions having relatively small extent. Such known surface resonators are flat ("pancake") coils having one or more turns. Such surface resonators are simply placed on the body part for which an image is to be obtained, for example, on a spinal vertebra, the middle ear, or an eye.

A known, circularly polarizing surface resonator for magnetic resonance imaging of a human body, whose body axis extends in the direction of the fundamental magnetic field, consists of two nested sub-systems. One of the sub-systems, known as a planar pair resonator, contains two annular-cylindrical coil turns formed by ribbon conductors. These coil turns are connected to each other via other conductors. The two coil turns are arranged side-by-side in the x-z plane. The second sub-system is known as a CRC (counter rotating current) resonator, and also contains two annular-cylindrical coil turns which are arranged above each other co-axially relative to the y-axis and parallel to the x-z plane. The planar pair resonator is disposed in the space between the two coils of the CRC resonator. An intrinic decoupling from uniform, external high frequency fields is obtained with this resonator. This embodiment has two differently constructed and arranged sub-systems, however, and is therefore suitable only for use with an apparatus wherein the fundamental magnetic field proceeds in the direction of the body axis, and moreover is relatively complicated. A system of this type is described in the article "Quadrature Detection Surface Coil," Hyde et al., Magnetic Resonance in Medicine, Vol. 4(1987), pp. 179-184.

Known fundamental field magnets are generally superconductive for stronger magnetic fields above 0.5T, and are generally in the form of solenoids, which generate a static fundamental field proceeding in the direction of the body axis of the patient. Other fundamental field magnets are also known for magnetic resonance imaging wherein the fundamental field extends perpendicular to the body axis of the examination subject, i.e., in the direction of the z-axis of a rectangular coordinate system. The magnet for generating such a fundamental magnetic field has pole pieces which define an imaging region, and between which the uniform fundamental field is generated. The pole pieces may be connected to each other via the yoke of a permanent magnet or of an electromagnet, and may form a C-magnet or H-magnet having two yokes, as described in European application 0 161 782. The fundamental magnetic field generated by such magnets is known as a transversal fundamental field.

SUMMARY OF THE INVENTION

It is an object of the present invention to provide a resonator for a magnetic resonance imaging tomography apparatus having a transversal fundamental magnetic field wherein the high frequency magnetic field vector components of the resonator lie substantially only in slice planes perpendicular to the fundamental magnetic field, for exciting nuclear spins in the region of the examination subject for which an image is to be obtained.

The above object is achieved in accordance with the principles of the present invention in a surface resonator consisting of two sub-systems, each sub-system generating a magnetic field with the magnetic fields of the sub-systems being perpendicular relative to each other. The respective currents of the two sub-systems are phase-shifted by 90° relative to each other, and each sub-system has at least one resonant capacitor. Each sub-system contains two current loops which both enclose the magnetic field allocated to them. All of the current loops are arranged at least approximately in the resonator plane perpendicularly relative to the fundamental field of the magnetic resonance imaging system in which the surface resonator is used. The useable part of the magnetic fields in the examination region lies outside of the resonator plane.

A circularly polarizing surface resonator is thereby obtained which is suitable both for transmission and reception of the radio frequency signals used in magnetic resonance tomography. A network is generally also provided between the ports of two sub-systems, plus a common 90°/3dB directional coupler for frequency tuning, load matching and balancing.

The high frequency magnetic field of this surface resonator for exciting the nuclear spins essentially contains only vector components in the imaging region that lie in sectional planes perpendicular to the fundamental field of the C-magnet (or H-magnet).

DESCRIPTION OF THE PREFERRED EMBODIMENTS

Figure 1:
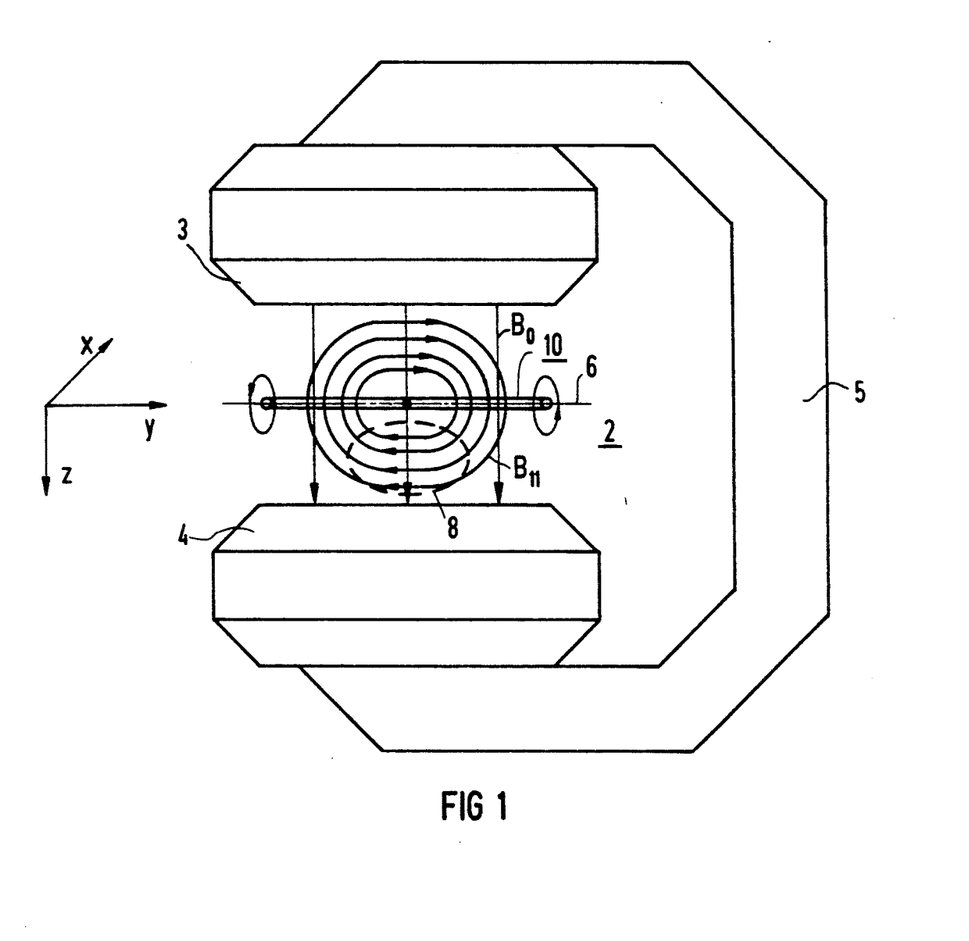
FIG. 1 is a schematic end view of a magnetic resonance imaging apparatus showing a surface resonator constructed in accordance with the principles of the present invention disposed between the poles of the fundamental field magnet.

A magnetic resonance imaging (MRI, or nuclear magnetic resonance (NMR)) apparatus is shown in FIG. 1 which includes a fundamental field magnet 2, for example, a C-magnet, having a shape so that the static, fundamental magnetic field $B_0$ generated thereby proceeds parallel to the z-axis of a rectangular coordinate system. The apparatus can be used to generate tomograms of parts of a human body whose body axis extends along the x-axis of the coordinate system. An examination region 8 is situated between the pole pieces 3 and 4 of the magnet 2.

In the embodiment of the magnet 2 shown in FIG. 1, at least those pole surfaces of the pole pieces 3 and 4 facing each other, as well as the yoke 5, are provided with a shielding (not shown) of electrically conductive material for the high-frequency field. Such shielding generally consists of copper.

The coordinate origin of the coordinate system should lie in a resonator plane 6, indicated with a dot-dash line, which extends perpendicularly to the z-axis. The coordinate origin will be in the center of a circularly polarizing surface resonator 10 between the pole pieces 3 and 4. For clarity, however, the coordinate axis is schematically shown in FIG. 1 to the side of the magnet 2. As discussed below, the resonator 10 produces a magnetic field $B_{11}$ which proceeds approximately parallel to the resonator plane 6 in the examination region 8.

Figure 2:
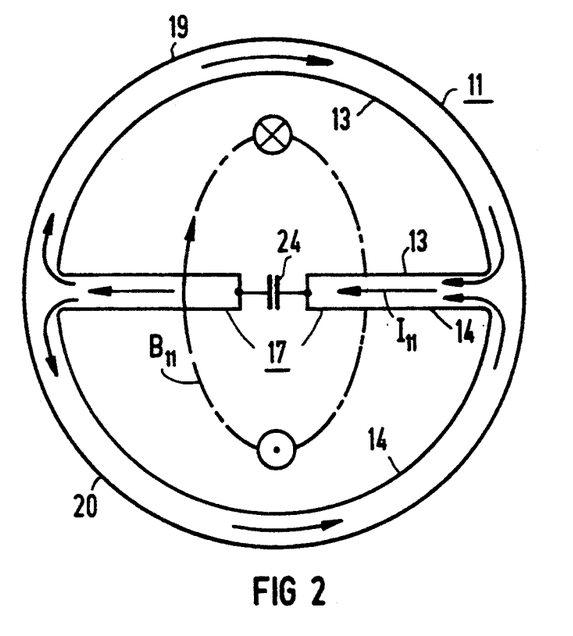
FIGS. 2 and 3 are respective plan views of the sub-systems of the surface resonator constructed in accordance with the principles of the present invention.
Figure 3:
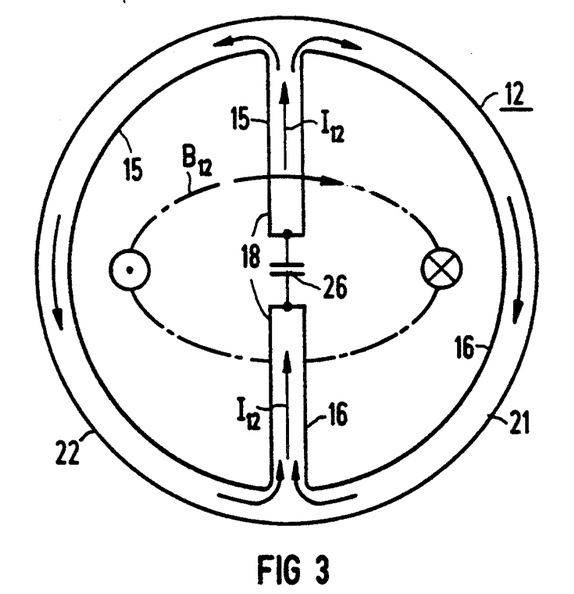

The resonator 10 is formed by sub-systems 11 and 12 shown respectively in FIGS. 2 and 3. The spatial orientation of the sub-systems 11 and 12 is preserved in FIGS. 2 and 3, however, it will be understood that the sub-systems 11 and 12 will be superimposed or combined, rather than being separated as shown in the drawings only for clarity.

As shown in FIG. 2, the sub-system 11 of the surface resonator 10 consists of two current loops 13 and 14 which are arranged geometrically parallel. The current loops contain a shared conductor section 17 and two mirror-symmetric conductor arcs 19 and 20. An gap in the conductor section 17 is bridged by a resonant capacitor 24. A resonant current $I_{11}$ flows in the conductor section 17, the resonant current $I_{11}$ being divided for flow into the conductor arcs 19 and 20, each of which forms a return path for this resonant current. The resonant current $I_{11}$ generates a magnetic field $B_{11}$, whose course is indicated by the dot-dash line in FIG. 2.

The sub-system 12 shown in FIG. 3 is fashioned in the same way, with two current loops 15 and 16 arranged spatially parallel to each other and sharing a conductor section 18. The direction of the conductor section 18 is rotated by 90° relative to the conductor section 17 of the sub-system 11 of FIG. 2. The conductor section 18 also has an gap, which is bridged by a resonant capacitor 26. A resonant current $I_{12}$ flows in the conductor section 18 and is divided between two mirror-symmetric conductor arcs 21 and 22, which provide respective return paths for the resonant current $I_{12}$. The resonant current $I_{12}$ produces a magnetic field $B_{12}$, whose course is indicated by the dot-dash line in FIG. 3, and which is rotated by 90° relative to the magnetic field $B_{11}$ of the sub-system 11.

Figure 4:
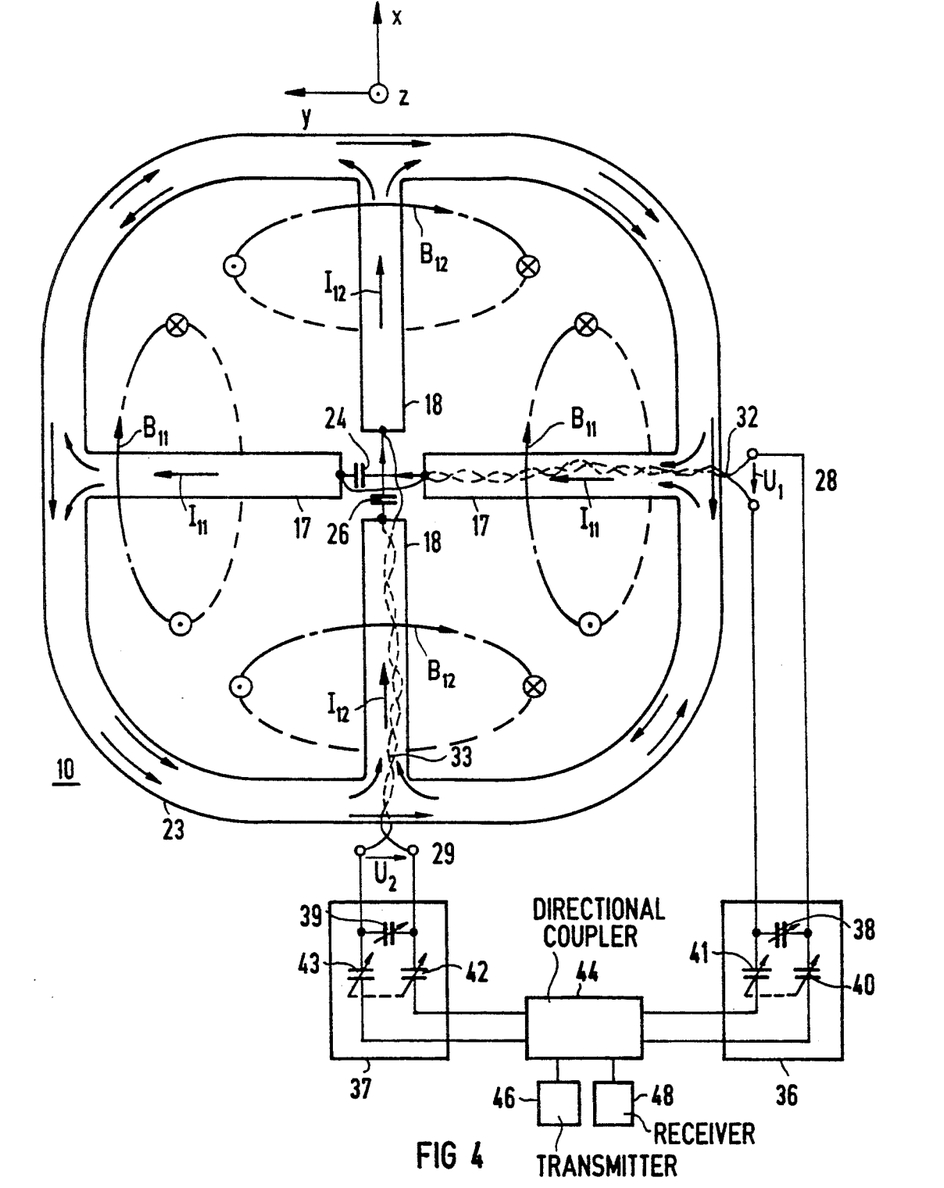
FIG. 4 is a plan view of surface resonator formed by a combination of the sub-systems of FIGS. 2 and 3 together with the connection to a transmitter and to a receiver.

A preferred embodiment of the surface resonator 10 is shown in FIG. 4 formed by a combination of the two sub-systems 11 and 12 of FIGS. 2 and 3. The two sub-systems 11 and 12 are placed on top of one another so as to be substantially arranged in the same plane, perpendicular to the fundamental magnetic field $B_0$. The combination of FIG. 4 may be formed by surrounding the two conductor sections 17 and 18, arranged perpendicular to each other in the same plane, by an annular, common, closed conductor 23, so that the arrangement is the form of a spoked wheel. The gaps in the conductor section 17 and 18 are respectively bridged by the capacitors 24 and 26. Energy is preferably fed into and out of the two sub-system at the resonant capacitors 24 and 26. The sub-systems are respectively fed by lines 32 and 33, each of which is balanced to ground and may be, for example, a twisted pair line or a ribbon conductor.

The surface resonator 10 preferably is a metallically rigid line, preferably consisting of copper. In the embodiment of the resonator 10 as a rigid line, it will have a relatively large surface and thus will have correspondingly low conductor losses. The lines 32 and 33 can be respectively laid in the interior of a part of the conductor sections 17 or 18.

The resonator 10 has ports 28 and 29 having respective voltages U1 and U2 indicated by respective directional arrows. The ports 28 and 29 are respectively connected to a transmitter 46 and a receiver 48 via lines of equal length via respective networks 36 and 37 which serve the purpose of frequency tuning, load matching and balancing, and via a common 90°/3dB directional coupler 44. The networks 36 and 37 respectively contain parallel capacitors 38 and 39 and series capacitors 40 and 41, and 42 and 43.

The energy feed-in and feed-out of the surface resonator 10 respectively ensue at the resonant capacitors 24 and 26. The magnetic field $B_{11}$ generated by the resonant current $I_{11}$ is disposed perpendicularly relative to the magnetic field $B_{12}$ generated by the resonant current $I_{12}$. The magnetic fields $B_{11}$ and $B_{12}$ of the sub-systems 11 and 12 are thus decoupled from one another. The energy feed-in via the ports 28 and 29 to the resonant capacitors 24 and 26 ensues such that the resonant currents $I_{11}$ and $I_{12}$ are chronologically offset by 90° relative to each other. The magnetic fields $B_{11}$ and $B_{12}$ thus have the relationship that when one of the magnetic fields is at a maximum, the other magnetic field will be zero. A substantially circularly polarized high frequency field can thus be generated with the surface resonator 10.

Figure 5:
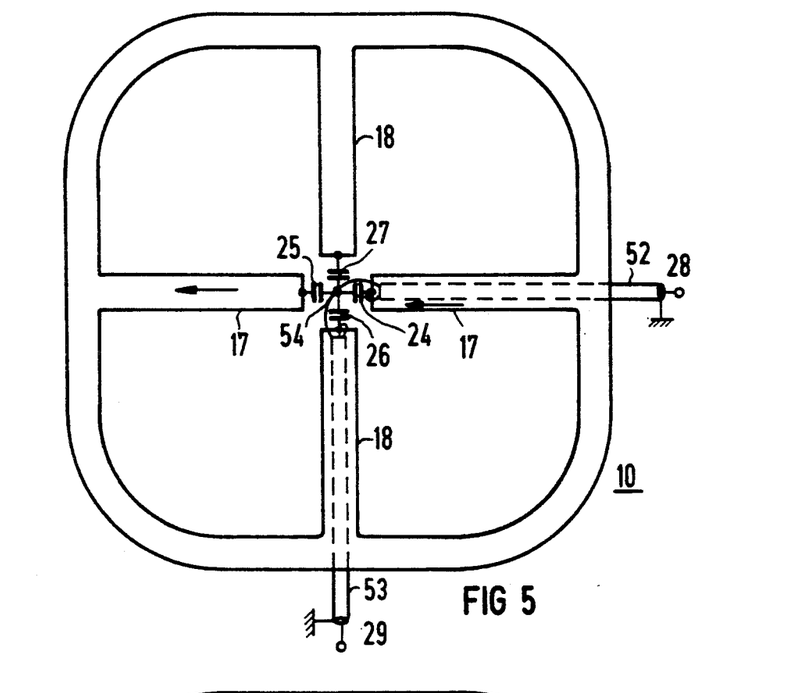
FIGS. 5 and 6 respectively show different types of energy feed-in to the sub-sytems.

In the embodiment of the surface resonator 10 shown in FIG. 5, an energy feed which is unbalanced to ground is provided. To this end, the gap in the gap in the conductor section 17 is bridged by resonant capacitors 24 and 25, and the gap in the conductor section 18 is bridged by series capacitors 26 and 27. A shared ground node 54, at zero potential, connects the resonant capacitors 24 and 27 to each other. In this embodiment, the resonant capacitor 24 is provided with an external connection via a coaxial conductor 52, which forms the port 28 for energy feed-in and feed-out. The coaxial conductor 52 is preferably laid within the tubular conductor section 17, and has a a cladding (not shown in the drawing) at ground. In the same manner, the resonant capacitor 26 is provided with an external connection, forming the port 29, via a coaxial cable 53. As a result of the shared ground node 54, a balancing of the sub-systems is possible in a simple manner. Because the capacitors 24 and 25, and the capacitors 26 and 27, are always connected in series in this embodiment, the surface resonator 10 in FIG. 5 has a correspondingly higher electric strength.

Figure 6:
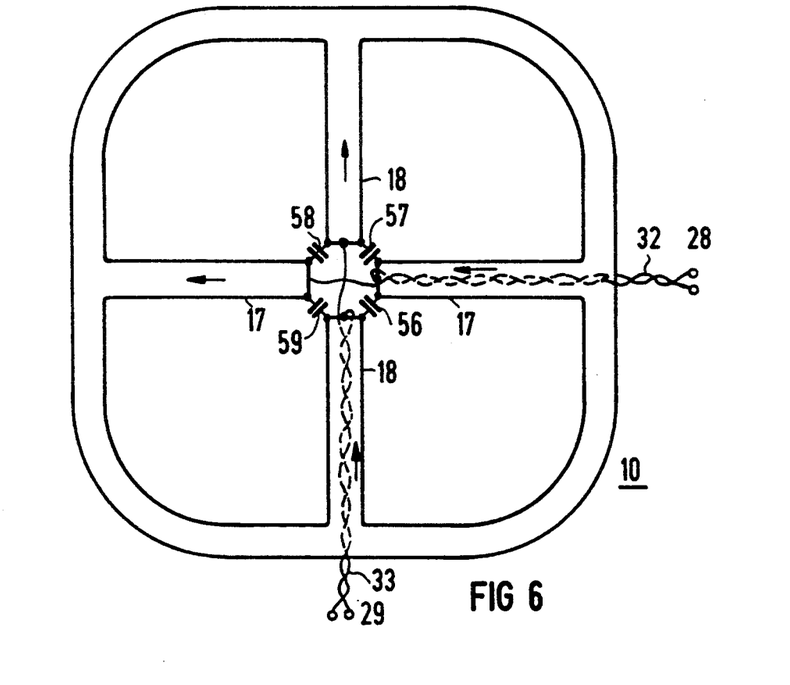

In the embodiment of a surface resonator 10 shown in FIG. 6, the open ends of the conductor sections 17 and 18 are respectively connected via a resonant capacitor to the two open ends of the conductors sections of the other sub-system. These resonant capacitors are referenced 56 through 59 in FIG. 6. The two ports 28 and 29 in this embodiment are formed by a twisted pair line 32 or 33 which is connected to the respective gap of the conductor sections 17 and 18. In this embodiment, the feed-in is balanced to ground, and the resonant capacitors 56 through 59 have the currents of both systems flowing therethrough. In this embodiment, the ends of the conductor sections are respectively connected to each other via a series circuit of two resonant capacitors, which function as a voltage divider. For example, the gap of the conductor section 17 is bridged by the resonant capacitors 56 and 59, as well as capacitors 57 and 58. Because the resonant capacitors 56 through 59 in this embodiment each receive only half of the voltage, the surface resonator 10 has a correspondingly increased electric strength. The energy feed-in ensues at the two ends of the conductor sections 17 and 18 which are opposite each other. No asymmetrical currents are thus possible, even given a high load on the surface resonator 10.

Figure 7:
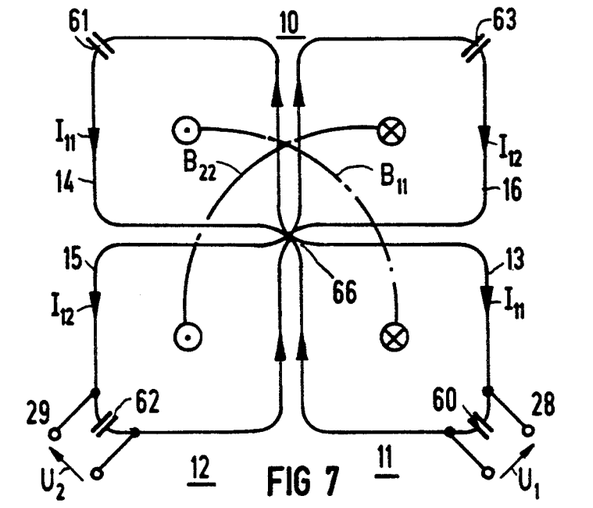
FIGS. 7 and 8 are schematic plan views of a "cloverleaf" arrangement of the current loops in the sub-systems.

In the embodiment of FIG. 7, a surface resonator 10 is formed by the two sub-systems 11 and 12 so that the current loops 13 and 14, and 15 and 16 are connected in succession in the shape of a cloverleaf. In this embodiment, a current loop, for example the current loop 13, of the sub-system 11 is disposed between the two current loops, for example the current loops 15 and 16, of the sub-system 12. The voltage $U_1$ and $U_2$ at the ports 28 and 29 of the sub-systems 11 and 12 are indicated in FIG. 7 by corresponding arrows. Except in the crossing region 66, the two current loops in each sub-system are arranged in the same plane, and are allocated to the same surface region of the examination subject. The conductors are crossed such that, between the current loops 13 and 14, the resonant current $I_{11}$ in the two current loops has an opposite directional sense, and a magnetic field $B_{11}$ arises, as indicated by the dot-dash lines in the figure. The two current loops 15 and 16 of the sub-system 12 are arranged in the same way, so that a magnetic field $B_{12}$ arises due to the resonant current $I_{12}$, the magnetic field $B_{12}$ being also indicated with dot-dash lines in FIG. 7, and proceeding perpendicularly relative to the magnetic field $B_{11}$. Each current loop contains a resonant capacitor, respectively referenced 60 through 63. The energy feed-in at the ports 28 and 29 ensues with 90° phase shift.

In the examination region 8, the surface resonator 10 generates essentially only field components of the high frequency field $B_{11}$ which proceed perpendicularly relative to the fundamental field $B_0$. When a resonant current $I_{11}$ flows in the sub-system 11, the indicated high frequency field distribution $B_{11}$ is generated. This oscillatory mode is compelled due to the interconnection of the two sub-coils, namely the crossing 66 of the coil conductor between the current loops 13 and 14. As a consequence of the symmetrical structure, the current induced by the magnetic field $B_{11}$ in the sub-system 12 is zero at the same time. The two sub-systems are thus decoupled from each other. When these high frequency fields are operated with a 90° phase difference, a substantially circularly polarized high frequency field can be generated in the examination region 8.

In a modified embodiment, a coupling loop (not shown in FIG. 7) can also be provided for the energy feed-in, this coupling loop being inductively coupled to one of the current loops of the two sub-systems.

The current loops 13 through 16 in the embodiment of FIG. 7 are approximately quadratic. It is possible, however, to provide turns having a different shape. Those corners of the turns lying opposite the crossing, at which the respective resonant capacitors 60 through 63 are disposed, may, for example, be rounded so that an approximately circular outer edge is produced.

In the embodiment of FIG. 7, the sub-systems are formed by a shared antenna conductor, which is preferably a tubular conductor. The conductors are electrically insulated from each other at the crossing 66, at which location the conductors of the two sub-systems 11 and 12 can be cast into an electrically non-conductive, self-curing plastic, for mechanical stabilization.

Figure 8:
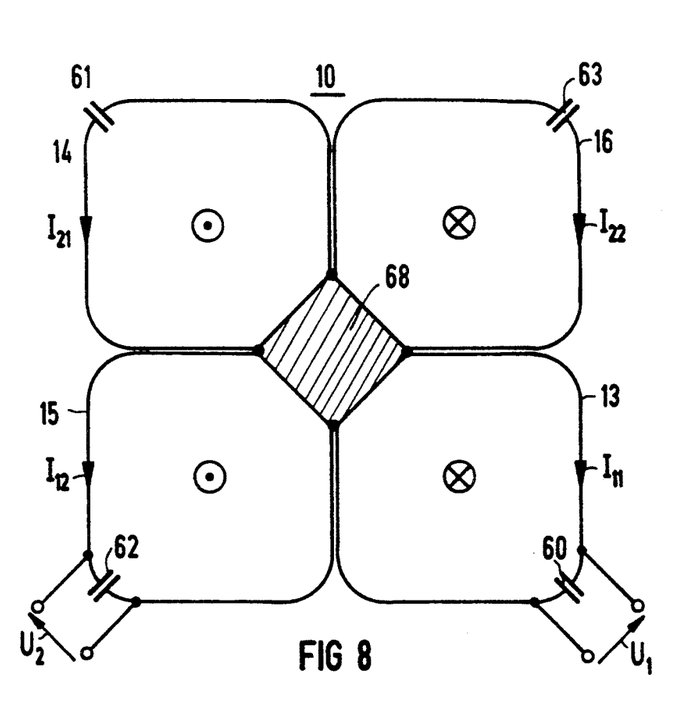

Under certain circumstances, however, it may be preferable to make the crossing 66 in the form of a line connection, as shown in FIG. 8. In the embodiment of FIG. 8, the current loops 13 and 14, and 15 and 16, are formed by separate conductors which are connected to a line connection 68 which is shared in common by all of the current loops. The line connection 68 is preferably formed by a planar conductor. Due to the symmetry of the sub-systems 11 and 12, the line connection 68 is at zero potential, and can therefore be connected to the system ground. A simple and stable structure of the surface resonator 10 is thereby achieved. The current paths of the resonant currents $I_{11}$ and $I_{21}$, as well as $I_{12}$ and $I_{22}$, in this embodiment do not necessarily arise on the basis of the discrete lines, because the resonant currents proceed across the line connection 68 so that a number of oscillatory modes are possible. The size of the resonant capacitors 60 through 63 is selected such that the frequency of the desired oscillatory mode, with the oppositely flowing resonant current $I_{11}$ and $I_{21}$, and oppositely flowing currents $I_{12}$ and $I_{22}$, is identical to the operating frequency of the magnetic resonance imaging tomography apparatus.

Figure 9:
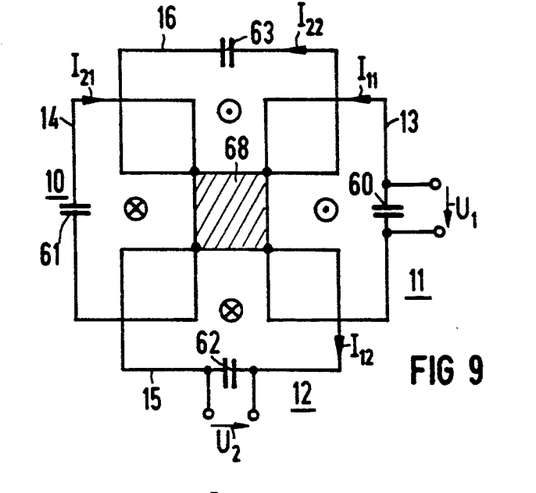
FIG. 9 is a plan view of an embodiment of the sub-systems having overlapping current loops.

In the embodiment shown in FIG. 9, sub-systems 11 and 12 having rectangular current loops 13 through 16 are provided, their size being selected so that they partially overlap. A shared line connection 68 is allocated to the current loops 13 through 16, and the resonant capacitors 60 through 63 are respectively arranged in the outer conductor segments which are opposite the shared line connection 68. In this symmetrical arrangement, the branch currents of the adjacent, orthogonal sub-systems 11 and 12 compensate, so that the systems are decoupled. The useable examination region is enlarged in this embodiment.

It may be preferably under some circumstances to round the outer conductor portions of the current loops 11 through 16 in the embodiment of FIG. 9, so that loops shapes approximating a kidney-shape are produced.

The overlap regions and the common line connection 68 may also be modified in shape and size so that a desired field characteristic is generated.

Figure 10:
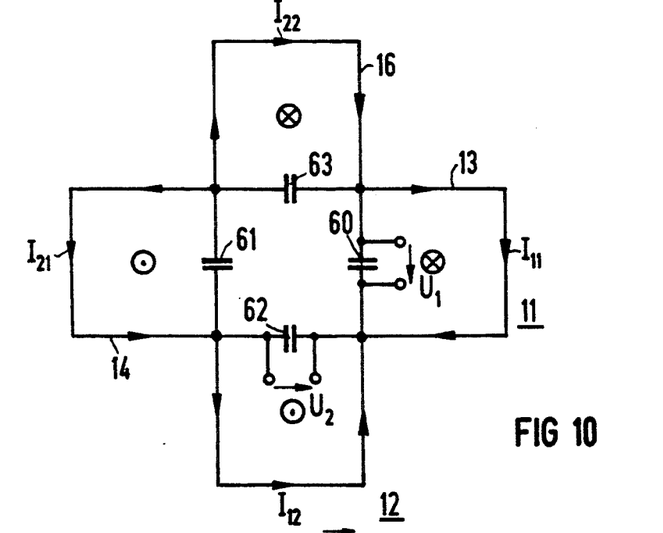
FIG. 10 is a plan view of an embodiment wherein the current loops are arranged so that the resonant capacitors form a square surrounded by the current loops.

In the embodiment of the surface resonator shown in FIG. 10, the conductor segments containing the capacitors 60 through 63 are connected together to approximately form a square, which is surrounded by the current loops 13 through 16. In this embodiment, the resonant capacitors 60 through 63 have the same spacing from the adjacent nodes of the sub-systems 11 and 12, and the connecting conductors at the nodes form a right angle. A plurality of current paths arise due to these nodes, so that a plurality of oscillatory modes are also possible in this embodiment. The value of the resonant capacitors 60 through 63 is selected so that the desired oscillatory mode is equal to the operating frequency of the magnetic resonance imaging tomography apparatus.

Figure 11:
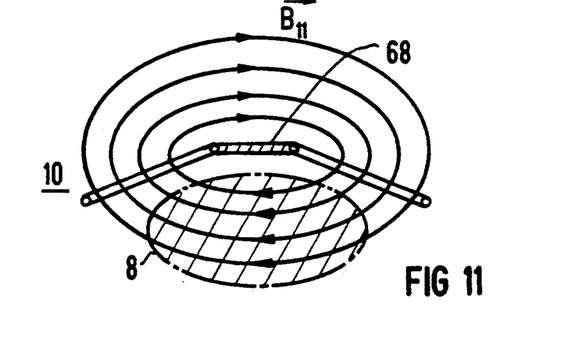
FIG. 11 is an end view of a further embodiment of the surface resonator showing the sub-systems inclined toward the examination subject.

In the embodiment of FIG. 11, the current loops (not separately referenced in FIG. 11) of the sub-systems 11 and 12 are inclined toward the examination region 8. The uniformity of the magnetic field in the examination region 8 is improved with this embodiment.

Although modifications and changes may be suggested by those skilled in the art, it is the intention of the inventors to embody within the patent warranted hereon all changes and modifications as resonably and properly come within the scope of their contribution to the art.

We claim as our invention:

1. A surface resonator for a magnetic resonance imaging tomography apparatus for conducting a diagnostic examination of an examination subject having a body axis extending along the x-axis of a rectangular coordinate system, said magnetic resonance imaging apparatus having a magnet with pole pieces which generates a fundamental magnetic field in the direction of the z-axis of said coordinate system, with an examination region disposed between said pole pieces, said surface resonator comprising:

two conductor sub-system means for generating and detecting respective magnetic fields perpendicularly relative to each other and having respective currents flowing therein phase-shifted by 90° relative to each other, each sub-system means having at least one resonant capacitor connected therein;

each sub-system means containing two current loops which both enclose the magnetic field allocated to them;

all of the current loops in said sub-systems being disposed substantially in a resonator plane perpendicular to said fundamental field; and said magnetic fields generated by said two sub-system means in combination forming a circularly polarized RF field having portions useable for image generation in said examination region disposed outside of said resonator plane.

2. A surface resonator as claimed in claim 1 wherein said conductor in each of said sub-system means consists of a metal tube.

3. A surface resonator as claimed in claim 1 wherein each sub-system means is formed by a parallel arrangement of two current loops, and each sub-system means having a straight conductor section, said straight conductor sections being disposed perpendicularly relative to each other and being electrically connected to and surrounded by a common, closed winding so that said resonator is in the shape of a spoked wheel.

4. A surface resonator as claimed in claim 3 wherein each of said straight conductor sections has an gap, and wherein said respective gaps are bridged by said resonant capacitor.

5. A surface resonator as claimed in claim 4 further comprising energy feed-in lines, balanced to ground, respectively connected to the resonant capacitor in each straight conductor section.

6. A surface resonator as claimed in claim 5 wherein said conductors of said two sub-systems consist of metal tubes, and wherein said lines are disposed inside of said straight conductor sections.

7. A surface resonator as claimed in claim 3 wherein each of said straight conductor sections has an gap bridged by two resonant capacitors connected in series, all of the resonant capacitors in both of said gaps in said straight conductor sections being connected to each other via a common ground node, and further comprising means for energy feed-in for each of said sub-system means connected to one of the resonant capacitors in the sub-system means.

8. A surface resonator as claimed in claim 7 wherein said means for energy feed-in is a coaxial cable.

9. A surface resonator as claimed in claim 3 wherein each of said straight conductor sections has an gap, said respective gaps substantially coinciding and each of said straight conductor sections being connected to the other straight conductor section by two resonant capacitors, and further comprising means for energy feed-in to each of said sub-system means disposed at opposite ends of each straight conductor section.

10. A surface resonator as claimed in claim 1 wherein said two current loops in each sub-system means are formed by a common conductor having a crossover between the two current loops so that both current loops in each sub-system have said current flowing therein in the form of a figure eight, said two sub-system means being respectively arranged so that one current loop in each sub-system means is disposed between the two current loops of the other sub-system means, so that said surface resonator is in the shape of a four-leaf clover.

11. A surface resonator as claimed in claim 10 wherein at least one current loop in each of said sub-system means contains a resonant capacitor connected at a location in said at least one current loop diagonally opposite said crossover.

12. A surface resonator as claimed in claim 10 wherein each of said current loops contains a resonant capacitor disposed at a location in said current loop diagonally opposite said crossover.

13. A surface resonator as claimed in claim 12 further comprising means for energy feed-in connected at one of said resonant capacitors in each sub-system means.

14. A surface resonator as claimed in claim 12 further comprising a coupling loop disposed in the proximity of one of said current loops for energy feed-in.

15. A surface resonator as claimed in claim 1 wherein said two current loops in each of said two sub-system means are disposed so that a current loop of one sub-system means is disposed between the two current loops of the other sub-system means and further comprising a common, planar line connection centrally disposed within, and electrically connected to, all of said current loops.

16. A surface resonator as claimed in claim 15 wherein at least one current loop in each sub-system means has a resonant capacitor connected therein at a location diagonally opposite said common, planar line connection.

17. A surface resonator as claimed in claim 15 wherein each of said current loops has a resonant capacitor connected therein disposed diagonally opposite said common, planar line connection.

18. A surface resonator as claimed in claim 1 wherein the two current loops in the two sub-system means are all electrically connected together by a common, centrally disposed planar line connection with each current loop in each of said sub-system means partially overlapping the two current loops in the other sub-system means.

19. A surface resonator as claimed in claim 18 wherein said planar line connection is disposed substantially in said resonator plane, and wherein the two current loops in at least of one said sub-systems are inclined out of said resonator plane toward said examination region.

20. A surface resonator as claimed in claim 1 wherein each of said current loops in the said two-system means has a resonant capacitor connected therein, said resonant capacitors in said respective current loops being connected to approximately form a square with a current loop extending from each side of said square.

* * * * *